United States Patent
Tseng et al.

(10) Patent No.: US 8,798,968 B2
(45) Date of Patent: *Aug. 5, 2014

(54) COMPUTING DEVICE AND METHOD FOR ENFORCING PASSIVITY OF SCATTERING PARAMETER EQUIVALENT CIRCUIT

(75) Inventors: Wen-Laing Tseng, New Taipei (TW); Yu-Chang Pai, New Taipei (TW); Cheng-Hsien Lee, New Taipei (TW); Shen-Chun Li, New Taipei (TW); Shou-Kuo Hsu, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 195 days.

This patent is subject to a terminal disclaimer.

(21) Appl. No.: 13/280,356

(22) Filed: Oct. 25, 2011

(65) Prior Publication Data

US 2012/0143584 A1 Jun. 7, 2012

(30) Foreign Application Priority Data

Dec. 3, 2010 (TW) ................ 99142000 A

(51) Int. Cl.
*G06F 7/60* (2006.01)
*G06G 7/48* (2006.01)
*G01R 15/00* (2006.01)

(52) U.S. Cl.
USPC ............ 703/2; 703/3; 703/14; 702/57

(58) Field of Classification Search
None
See application file for complete search history.

(56) References Cited

U.S. PATENT DOCUMENTS

| | | | |
|---|---|---|---|
| 7,996,169 B2 * | 8/2011 | Lin et al. | 702/75 |
| 8,155,934 B2 * | 4/2012 | Gustavsen et al. | 703/2 |
| 8,494,820 B2 * | 7/2013 | Tseng et al. | 703/2 |
| 2003/0088394 A1 * | 5/2003 | Min et al. | 703/14 |
| 2006/0010406 A1 * | 1/2006 | Lee et al. | 716/5 |
| 2007/0005324 A1 * | 1/2007 | Gong et al. | 703/14 |
| 2009/0171604 A1 * | 7/2009 | Lin et al. | 702/75 |

* cited by examiner

*Primary Examiner* — Omar Fernandez Rivas
*Assistant Examiner* — Nithya J Moll
(74) *Attorney, Agent, or Firm* — Novak Druce Connolly Bove + Quigg LLP

(57) ABSTRACT

A computing device and a method for scattering parameter equivalent circuit reads a scattering parameter file from a storage device. A non-common-pole rational function of the scattering parameters in the scattering parameter file is created by applying a vector fitting algorithm to the scattering parameters. Passivity of the non-common-pole rational function is enforced if the non-common-pole rational function does not satisfy a determined passivity requirement.

12 Claims, 4 Drawing Sheets

COMPUTING DEVICE AND METHOD FOR ENFORCING PASSIVITY OF SCATTERING PARAMETER EQUIVALENT CIRCUIT

BACKGROUND

1. Technical Field

Embodiments of the present disclosure relates to circuit simulating methods, and more particularly, to a computing device and a method for enforcing passivity of scattering parameter (S-parameter) equivalent circuit.

2. Description of Related Art

Scattering parameters (S-parameters) are useful for analyzing behaviour of circuits without regard to detailed components of the circuits. The S-parameters may be measured at ports of a circuit at different signal frequencies. In a high frequency and microwave circuit design, the S-parameters of the circuit may be used to create a rational function, and the rational function may be used to generate an equivalent circuit model, which may be applied to time-domain analysis for the circuit design. For judging whether the circuit design satisfies stability requirements, the time-domain analysis result should be convergent. To ensure constringency, the rational function and the equivalent circuit model of the S-parameters are required to be passive.

DETAILED DESCRIPTION

In general, the word "module," as used hereinafter, refers to logic embodied in hardware or firmware, or to a collection of software instructions, written in a programming language, such as, for example, Java, C, or Assembly. One or more software instructions in the modules may be embedded in firmware. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
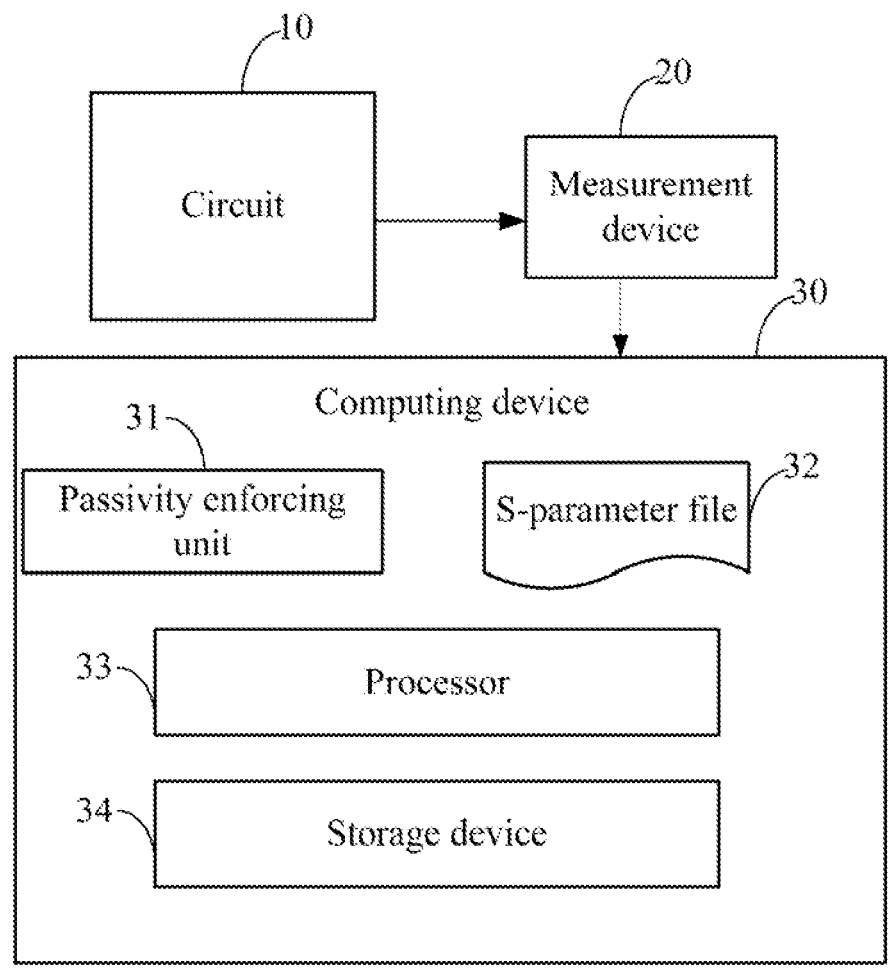
FIG. 1 is a block diagram of one embodiment of a computing device for enforcing passivity of S-parameter equivalent circuit.

FIG. 1 is a block diagram of one embodiment of a computing device 30 for enforcing passivity of an S-parameter equivalent circuit. The computing device 30 is connected to a measurement device 20. The measurement device 20 is operable to measure S-parameters at ports of a circuit 10, to obtain an S-parameter file 32, and stores the S-parameter file 32 in a storage device 34 of the computing device 30. Depending on the embodiment, the storage device 34 may be a smart media card, a secure digital card, or a compact flash card. The measurement device 20 may be a network analyzer. The computing device 30 may be a personal computer, or a server, for example.

In this embodiment, the computing device 30 further includes a passivity enforcing unit 31 and at least one processor 33. The passivity enforcing unit 31 includes a number of function modules (depicted in FIG. 2) The function modules may comprise computerized code in the form of one or more programs that are stored in the storage device 34. The computerized code includes instructions that are executed by the at least one processor 33, to create a non-common-pole rational function of the S-parameters, and analyze if the non-common-pole rational function satisfies determined passivity requirements, and enforces passivity of the non-common-pole rational function if the non-common-pole rational function does not satisfy the determined passivity requirements.

Figure 2:
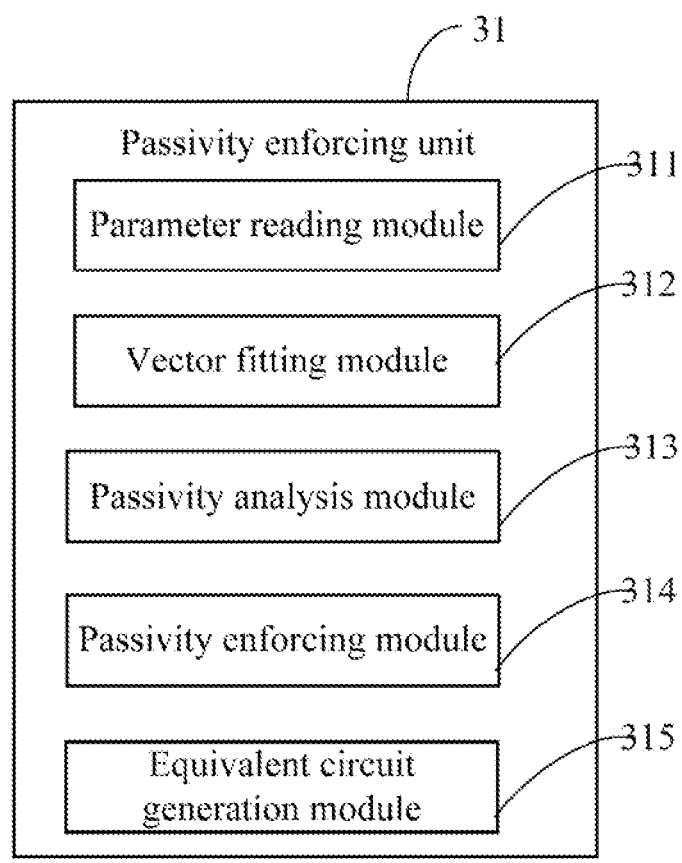
FIG. 2 is a block diagram of one embodiment of function modules of a passivity enforcing unit in the computing device of FIG. 1.

FIG. 2 is a block diagram of one embodiment of the function modules of the passivity enforcing unit 31 in the computing device 30 of FIG. 1. In one embodiment, the passivity enforcing unit 31 includes a parameter reading module 311, a vector fitting module 312, a passivity analysis module 313, a passivity enforcing module 314, and an equivalent circuit generation module 315. A description of functions of the modules 311 to 315 are included in the following description of FIG. 3.

Figure 3:
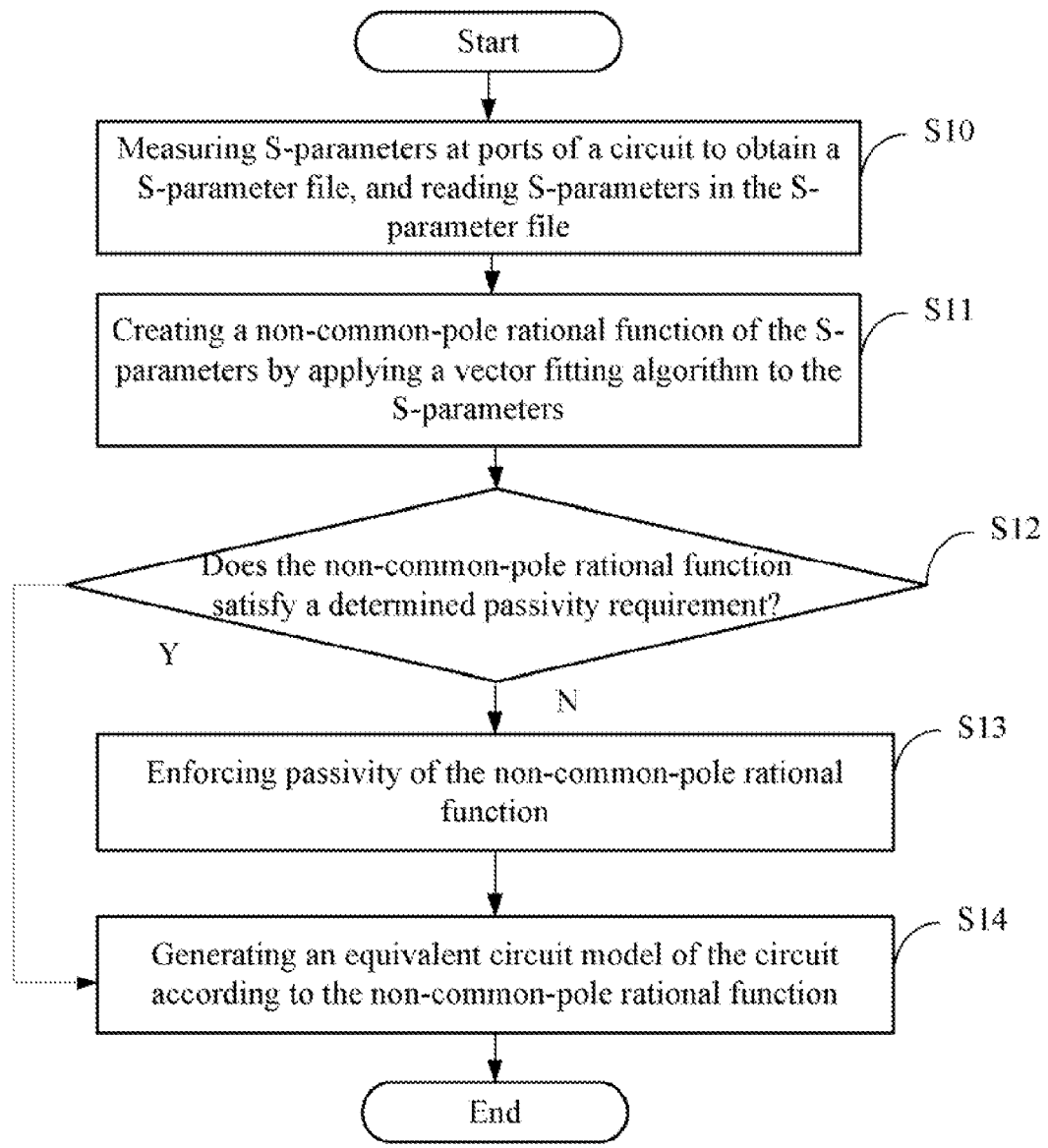
FIG. 3 is a flowchart of one embodiment of a method for enforcing passivity of an S-parameter equivalent circuit.

FIG. 3 is a flowchart of one embodiment of a method for enforcing passivity of an S-parameter equivalent circuit. Depending on the embodiment, additional blocks may be added, others removed, and the ordering of the blocks may be changed.

In block S10, the measurement device 20 measures S-parameters at ports of the circuit 10, to obtain the S-parameter file 32, and stores the S-parameter file 32 in the storage device 34. The parameter reading module 311 reads the S-parameters from the S-parameter file 32.

In block S11, the vector fitting module 312 creates a non-common-pole rational function of the S-parameters by applying a vector fitting algorithm to the S-parameters. In one embodiment, the non-common-pole rational function of the S-parameters may be the following function labeled (1):

$$S(s) \approx \hat{S}(s) = \begin{bmatrix} \hat{S}_{11}(s) & \hat{S}_{12}(s) & \ldots & \hat{S}_{1N}(s) \\ \hat{S}_{21}(s) & \hat{S}_{22}(s) & \ldots & \hat{S}_{2N}(s) \\ \ldots & \ldots & \ldots & \ldots \\ \hat{S}_{N1}(s) & \hat{S}_{N2}(s) & \ldots & \hat{S}_{NN}(s) \end{bmatrix}, \quad (1)$$

wherein, $$\hat{S}_{ij}(s) = \sum_{m=1}^{M} \frac{r_m^{i,j}}{s + p_m^{i,j}}.$$

In the function (1), M represents control precision of the function, N represents the number of the ports of the circuit 10, $r_m$ represents residue values, $p_m$ represents pole values, $s=\omega=2\pi f$, $f$ represents a frequency of a test signal, and $d_m$ represents a constant. It is understood that control precision means how many pairs of pole-residue values are utilized in the function (1).

Figure 4:
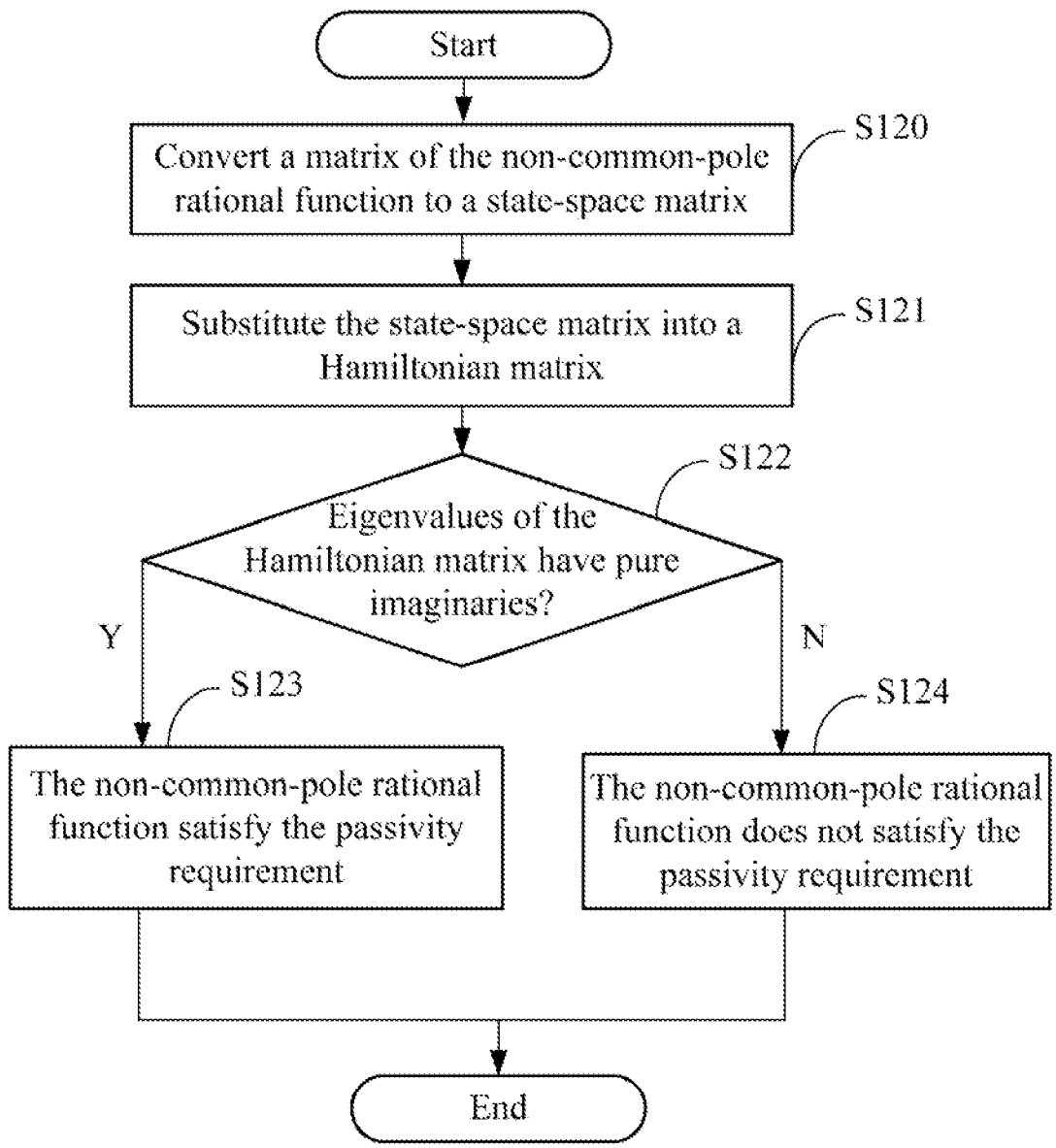
FIG. 4 is a flowchart of one embodiment detailing S12 in FIG. 3.

In block S12, the passivity analysis module 313 determines if the non-common-pole rational function satisfies a determined passivity requirement. A detailed description of block S12 is depicted in FIG. 4. If the non-common-pole rational function does not satisfy the determined passivity requirement, block S13 is implemented. Otherwise, if the non-common-pole rational function satisfies the determined passivity requirement, block S14 is directly implemented.

In block S13, the passivity enforcing module 314 enforces passivity of the non-common-pole rational function. In one embodiment, passivity of the non-common-pole rational function is enforced by converting the function (1) to the following function labeled (2):

$$[S] = \begin{bmatrix} \sum_{m=1}^{M} \frac{r_m^{1,1}}{s+p_m^{1,1}} & \sum_{m=1}^{M} \frac{r_m^{1,2}}{s+p_m^{1,2}} & \cdots & \sum_{m=1}^{M} \frac{r_m^{1,N}}{s+p_m^{1,N}} \\ \sum_{m=1}^{M} \frac{r_m^{2,1}}{s+p_m^{2,1}} & \sum_{m=1}^{M} \frac{r_m^{2,2}}{s+p_m^{2,2}} & \cdots & \sum_{m=1}^{M} \frac{r_m^{2,N}}{s+p_m^{2,N}} \\ \cdots & \cdots & \cdots & \cdots \\ \sum_{m=1}^{M} \frac{r_m^{1,N}}{s+p_m^{1,N}} & \sum_{m=1}^{M} \frac{r_m^{2,N}}{s+p_m^{2,N}} & \cdots & \sum_{m=1}^{M} \frac{r_m^{N,N}}{s+p_m^{N,N}} \end{bmatrix} \quad (2)$$

$$= \sum_{m=1}^{M} \sum_{i=1}^{N} \sum_{j=1}^{i} \frac{r_m^{i,j}}{s+p_m^{i,j}} E_{i,j}.$$

In the function (2), E is a matrix may be shown using the following function labeled (3):

$$E_{u,v}(i,j) = \begin{cases} 1, & i = (u \text{ or } v), j = (u \text{ or } v) \text{ and } i \neq j \\ 0, & o.w., \end{cases} \quad (3)$$

$(u \neq v)$ $$E_{u,v}(i,j) = \begin{cases} 1, & i = j = u = v \\ 0, & o.w., \end{cases}$$

$(u = v).$

Using function (2), $\tilde{S}$, which represents modified S-parameters, may be found using the following function labeled (4):

$$[\tilde{S}] \cong S + \Delta S \quad (4)$$

$$= \sum_{m=1}^{M} \sum_{i=1}^{N} \left[ \frac{E_{i,i}(r_m^{i,i} + \Delta\lambda_{m,i,i})}{s+p_m^{i,i}} + \sum_{\substack{j=1 \\ (j \neq i)}}^{i} \frac{E_{i,j}(r_m^{i,j} + \Delta\lambda_{m,i,j})}{s+p_m^{i,j}} \right].$$

In the function (4), $\Delta\lambda$ is solved may be using the following functions labeled (5a) and (5b) according to quadratic programming (QP):

$$\min_{\Delta x} \frac{1}{2}(\Delta x^T A_{sys}^T A_{sys} \Delta x); \quad (5a)$$

$$B_{sys}\Delta x < c. \quad (5b)$$

Function (5a) is a least square equation. $A_{sys}^T A_{sys}$ in function (5a) may be showed using the following function labeled (6):

$$A_{sys}^T A_{sys} = \sum_{k=0}^{N_s} A_{base}(s_k)^T A_{base}(s_k). \quad (6)$$

In the function (6), $s_k$ are different signal frequencies listed in the S-parameter file 32.
$A_{base}(s_k)$ in the function (6) and $\Delta x$ in the function (5a) may be showed using the following functions labeled (7a) and (7b):

$$A_{base}(s_k) = [A_{base}^1(s_k) \ A_{base}^2(s_k) \ \cdots \ A_{base}^M(s_k)], \quad (7a)$$

$$A_{base}^m(s_k) = A_s A_{pole}^m(s_k),$$

$$\Delta x = \begin{bmatrix} \Delta x_1 \\ \Delta x_2 \\ \cdots \\ \Delta x_M \end{bmatrix}, \Delta x_m = \begin{bmatrix} \Delta\lambda_{m,1,1} \\ \Delta\lambda_{m,2,1} \\ \Delta\lambda_{m,2,2} \\ \cdots \\ \Delta\lambda_{m,N,N} \end{bmatrix}$$

$$A_s = \begin{bmatrix} 1 & 0 & 0 & \cdots & 0 \\ 0 & \sqrt{2} & 0 & \cdots & 0 \\ 0 & 0 & 1 & \cdots & 0 \\ \cdots & \cdots & \cdots & \cdots & \cdots \\ 0 & 0 & 0 & \cdots & 1 \end{bmatrix},;$$

$$A_{pole}^m(s_k) = \begin{bmatrix} \frac{1}{s_k+p_m^{1,1}} & 0 & 0 & \cdots & 0 \\ 0 & \frac{1}{s_k+p_m^{2,1}} & 0 & \cdots & 0 \\ 0 & 0 & \frac{1}{s_k+p_m^{2,2}} & \cdots & 0 \\ \cdots & \cdots & \cdots & \cdots & \cdots \\ 0 & 0 & 0 & \cdots & \frac{1}{s_k+p_m^{N,N}} \end{bmatrix}. \quad (7b)$$

Function (5b) is a constrain equation. $B_{sys}$ and c in function (5b) may be showed using the following function labeled (8):

$$B_{sys} = \begin{bmatrix} b_k(s_1) \\ b_k(s_2) \\ \cdots \\ b_k(s_q) \end{bmatrix}, c = \begin{bmatrix} \Delta\sigma_k^{s_1} \\ \Delta\sigma_k^{s_2} \\ \cdots \\ \Delta\sigma_k^{s_q} \end{bmatrix}. \quad (8)$$

In the function (8), $\Delta\sigma_k^{s_q}$ is a modified value of a non-passivity system, k is the kth singular value of the S-parameters, $s_q$ is a frequency of the local maximum singular value when k>1.

The $b_k(s)$ in function (8) may be showed using the following function labeled (9):

$$b_k(s) = [u_k B_{base}(s)(I_{N_c \times M} \otimes v_k)] \quad (9).$$

In the function (9), $I_{N_c \times M}$ is a ($N_c \times M$)×($N_c \times M$) identity matrix, $$N_c = \frac{(1+N)N}{2} M,$$

$\otimes$ is Kronecker tensor product, u and v may be showed using the following function labeled (10):

$$U^{-1} = \begin{bmatrix} u_1 \\ \cdots \\ u_N \end{bmatrix}, V = [v_1 \ \cdots \ v_N]. \quad (10)$$

$B_{base}(s)$ in function (9) may be showed using the following function labeled (11):

$$B_{base}(s) = [B_{base}^1(s) B_{base}^2(s) \ldots B_{base}^M(s)], B_{base}^m(s) = B_C B_{pole}^m(s) \quad (11).$$

In the function (11), $B_c$ and $B_{pole}{}^m(s)$ may be showed using the following function labeled (12):

$$B_c = [\, E_{1,1} \quad E_{2,1} \quad E_{2,2} \quad \ldots \quad E_{N,N} \,] \qquad (12)$$

$$B_{pole}^m(s) = \begin{bmatrix} \frac{I_N}{s+p_m^{1,1}} & 0 & 0 & \ldots & 0 \\ 0 & \frac{I_N}{s+p_m^{2,1}} & 0 & \ldots & 0 \\ 0 & 0 & \frac{I_N}{s+p_m^{2,2}} & \ldots & 0 \\ 0 & 0 & 0 & \ldots & \ldots \\ 0 & 0 & 0 & \ldots & \frac{I_N}{s+p_m^{N,N}} \end{bmatrix}.$$

In the function (12), $I_N$ is a N×N identity matrix.

In block S14, the equivalent circuit generation module 315 generates an equivalent circuit model of the circuit 10 according to the non-common-pole rational function adjusted in block S13 which satisfies the determined passivity requirement.

FIG. 4 is a flowchart of one embodiment detailing S12 in FIG. 3. Depending on the embodiment, additional blocks may be added, others removed, and the ordering of the blocks may be changed.

In block S120, the passivity analysis module 313 converts the non-common-pole rational function to a state-space matrix. As mentioned above, the non-common-pole rational function is the following function (1):

$$S(s) \approx \hat{S}(s) = \begin{bmatrix} \hat{S}_{11}(s) & \hat{S}_{12}(s) & \ldots & \hat{S}_{1N}(s) \\ \hat{S}_{21}(s) & \hat{S}_{22}(s) & \ldots & \hat{S}_{2N}(s) \\ \ldots & \ldots & \ldots & \ldots \\ \hat{S}_{N1}(s) & \hat{S}_{N2}(s) & \ldots & \hat{S}_{NN}(s) \end{bmatrix}, \qquad (1)$$

$$\text{wherein, } \hat{S}_{ij}(s) = \sum_{m=1}^{M} \frac{r_m^{i,j}}{s+p_m^{i,j}}.$$

In one embodiment, the matrix conversion module 313 combines the function (1) and the following functions labeled (13a) and (13b) to obtain a combined matrix, then converts the combined matrix into the state-space matrix using the following function labeled (14):

$$\hat{S}r_{p,q}(s) = \sum_{u=1}^{U} \frac{r_u^{p,q}}{s+p_u^{p,q}} \qquad (13a)$$

where $p_u^{p,q}$ and $r_u^{p,q}$ are real numbers.

$$\hat{S}c_{p,q}(s) = \sum_{v=1}^{V} \frac{\text{Re}(r_v^{p,q})+\text{Im}(r_v^{p,q})j}{s+\text{Re}(p_v^{p,q})+\text{Im}(p_v^{p,q})j} + \frac{\text{Re}(r_v^{p,q})-\text{Im}(r_v^{p,q})j}{s+\text{Re}(p_v^{p,q})-\text{Im}(p_v^{p,q})j} \qquad (13b)$$

where $j=\sqrt{-1}$, $U+2V=M$, $p_u^{p,q}>0$, and $\text{Re}(p_v^{p,q})>0$.

$$j\omega X(j\omega) = AX(j\omega) + BU(j\omega)$$

$$Y(j\omega) = CX(j\omega) + DU(j\omega), \qquad (14).$$

In the function (14), A, B, C, and D may be showed using the following function (15):

$$A = \begin{bmatrix} A_r & 0 \\ 0 & A_c \end{bmatrix}, B = \begin{bmatrix} B_r \\ B_c \end{bmatrix}, C = [\, C_r \quad C_c \,], \qquad (15)$$

$$D = \begin{bmatrix} d^{1,1} & d^{1,2} & \ldots & d^{1,N} \\ d^{2,1} & d^{2,2} & \ldots & D^{2,N} \\ \ldots & \ldots & \ldots & \ldots \\ d^{N,1} & d^{N,1} & \ldots & d^{N,N} \end{bmatrix}.$$

In the function (15), $A_r$, $B_r$ and $C_r$ are state-space matrixes of the pole values $\hat{S}r_{p,q}(s)$ in (13a), and may be showed using the following function labeled (16):

$$A_r(i,j) = \begin{cases} p_u^{p,q}, & i=j \text{ and } i=(U\cdot N)(p-1)+U(q-1)+u \\ 0 & o.w. \end{cases} \qquad (16)$$

$$B_r(i,j) = \begin{cases} 1, & i=(U\cdot N)(p-1)+U(q-1)+u \text{ and } j=q \\ 0 & o.w. \end{cases}$$

$$C_r(i,j) = \begin{cases} r_u^{p,q}, & i=p \text{ and } j=(U\cdot N)(p-1)+U(q-1)+u \\ 0 & o.w.. \end{cases}$$

In the function (16), $A_r$ is a (N·N·U)×(N·N·U) sparse matrix, $B_r$ is a (N·U)×N sparse matrix, $C_r$ is a N×(N·U) sparse matrix.

$A_c$, $B_c$, and $C_c$ are state-space matrixes of the residue values $\hat{S}c_{p,q}(s)$ in (13b), and may be showed using the following function (17):

$$A_c(i,j) = \begin{cases} \text{Re}(p_v^{p,q}), & i=j \text{ and } i=\Psi(p,q,v), i=\Psi(p,q,v)-1 \\ \text{Im}(p_v^{p,q}), & i=\Psi(p,q,v)-1, j=\Psi(p,q,v) \\ -\text{Im}(p_v^{p,q}), & i=\Psi(p,q,v), j=\Psi(p,q,v)-1 \\ 0, & o.w. \end{cases} \qquad (17)$$

$$B_c(i,j) = \begin{cases} 2, & i=\Psi(p,q,v)-1 \text{ and } j=q \\ 0 & o.w. \end{cases}$$

$$C_c(i,j) = \begin{cases} \text{Re}(r_v^{p,q}), & i=p \text{ and } j=\Psi-1 \\ \text{Im}(r_v^{p,q}), & i=p \text{ and } j=\Psi \\ 0, & o.w.. \end{cases}$$

In the function (17), $\Psi(p,q,v)=(2V\cdot N)(p-1)+2V(q-1)+2v$, $A_c$ is a sparse matrix, $B_r$ is a (N·2V)×N sparse matrix, and $C_r$ is a N×(N·2V) sparse matrix.

The matrix conversion module 313 combines the functions (15), (16), and (17) to obtain expressions of the coefficients A, B, C, and D in the state-space matrix of the function (14).

In block S121, the passivity analysis module 313 substitutes the state-space matrix of the function (14) into a Hamiltonian matrix, where the Hamiltonian matrix is the following function labeled (18):

$$H = \begin{bmatrix} A-BR^{-1}D^TC & -BR^{-1}B^T \\ C^TQ^{-1}C & -A^T+C^TDR^{-1}B^T \end{bmatrix} \qquad (18)$$

where $R=D^TD-I$ $Q=DD^T-I$, I is an identity matrix.

In block S309, the passivity analysis module 313 analyzes the eigenvalues of the Hamiltonian matrix for pure imaginaries, to determine if the non-common-pole rational function of the S-parameters satisfies a determined passivity requirement. If the eigenvalues of the Hamiltonian matrix have pure imaginaries, the passivity analysis module 313 determines that the non-common-pole rational function of the S-parameters satisfies the determined passivity requirement. Otherwise, if the eigenvalues of the Hamiltonian matrix have no pure imaginaries, the passivity analysis module 313 determines that the non-common-pole rational function of the S-parameters does not satisfy the determined passivity requirement.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computing device, comprising:
a storage device;
at least one processor; and
a passivity enforcing unit comprising one or more computerized codes, which are stored in the storage device and executable by the at least one processor, the one or more computerized codes comprising:
a parameter reading module operable to read a scattering parameter (S-parameter) file from the storage device, wherein the S-parameter file lists S-parameters measured at ports of a circuit at different signal frequencies;
a vector fitting module operable to create a non-common-pole rational function of the S-parameters by applying a vector fitting algorithm to the S-parameters;
a passivity enforcing module operable to enforce passivity of the non-common-pole rational function if the non-common-pole rational function does not satisfy a determined passivity requirement; and
an equivalent circuit generation module operable to generate an equivalent circuit model of the circuit according to the non-common-pole rational function which satisfies the determined passivity requirement by enforcing passivity.

2. The computing device as claimed in claim 1, wherein the passivity enforcing module enforces passivity of the non-common-pole rational function by the operation of:
converting the non-common-pole rational function which is showed using the function labeled (1) to a function labeled (2):

$$S(s) \approx \hat{S}(s) = \begin{bmatrix} \hat{S}_{11}(s) & \hat{S}_{12}(s) & \cdots & \hat{S}_{1N}(s) \\ \hat{S}_{21}(s) & \hat{S}_{22}(s) & \cdots & \hat{S}_{2N}(s) \\ \cdots & \cdots & \cdots & \cdots \\ \hat{S}_{N1}(s) & \hat{S}_{N2}(s) & \cdots & \hat{S}_{NN}(s) \end{bmatrix}, \quad (1)$$

wherein, $\hat{S}_{ij}(s) = \sum_{m=1}^{M} \frac{r_m^{i,j}}{s + p_m^{i,j}}$ $$[S] = \begin{bmatrix} \sum_{m=1}^{M} \frac{r_m^{1,1}}{s + p_m^{1,1}} & \sum_{m=1}^{M} \frac{r_m^{1,2}}{s + p_m^{1,2}} & \cdots & \sum_{m=1}^{M} \frac{r_m^{1,N}}{s + p_m^{1,N}} \\ \sum_{m=1}^{M} \frac{r_m^{2,1}}{s + p_m^{2,1}} & \sum_{m=1}^{M} \frac{r_m^{2,2}}{s + p_m^{2,2}} & \cdots & \sum_{m=1}^{M} \frac{r_m^{2,N}}{s + p_m^{2,N}} \\ \cdots & \cdots & \cdots & \cdots \\ \sum_{m=1}^{M} \frac{r_m^{1,N}}{s + p_m^{1,N}} & \sum_{m=1}^{M} \frac{r_m^{2,N}}{s + p_m^{2,N}} & \cdots & \sum_{m=1}^{M} \frac{r_m^{N,N}}{s + p_m^{N,N}} \end{bmatrix} \quad (2)$$

$$= \sum_{m=1}^{M} \sum_{i=1}^{N} \sum_{j=1}^{i} \frac{r_m^{i,j}}{s + p_m^{i,j}} E_{i,j}.$$

wherein M represents control precision of the function, N represents the number of the ports of the circuit, $r_m$ represents residue values, $p_m$ represents pole values, $s = \omega = 2\pi f$, $f$ represents a frequency of a test signal, and $E_{i,j}$ represents a matrix.

3. The computing device as claimed in claim 1, wherein the one or more computerized code further comprises:
a passivity analysis module operable to determine if the non-common-pole rational function satisfies the determined passivity requirement.

4. The computing device as claimed in claim 3, wherein the passivity analysis module determines if the non-common-pole rational function satisfies the determined passivity requirement by the operations of:
converting the non-common-pole rational function to a state-space matrix;
substituting the state-space matrix into a Hamiltonian matrix, analyzing if eigenvalues of the Hamiltonian matrix have pure imaginaries, and determining that the non-common-pole rational function of the S-parameters satisfies a determined passivity requirement if the eigenvalues of the Hamiltonian matrix have pure imaginaries, or determining that the non-common-pole rational function of the S-parameters does not satisfy the determined passivity requirement if the eigenvalues of the Hamiltonian matrix have no pure imaginaries.

5. A computer-based method for enforcing passivity of scattering parameter (S-parameter) equivalent circuit, the method being performed by execution of computer readable program code by a processor of a computing device, and comprising:
reading a S-parameter file from a storage device, wherein the S-parameter file lists S-parameters measured at ports of a circuit at different signal frequencies;
creating a non-common-pole rational function of the S-parameters by applying a vector fitting algorithm to the S-parameters;
enforcing passivity of the non-common-pole rational function if the non-common-pole rational function does not satisfy a determined passivity requirement; and
generating an equivalent circuit model of the circuit according to the non-common-pole rational function which satisfies the determined passivity requirement by enforcing passivity.

6. The method as claimed in claim 5, wherein passivity of the non-common-pole rational function is enforced by:
converting the non-common-pole rational function which is showed using a function labeled (1) to a function labeled (2):

$$S(s) \approx \hat{S}(s) = \begin{bmatrix} \hat{S}_{11}(s) & \hat{S}_{12}(s) & \ldots & \hat{S}_{1N}(s) \\ \hat{S}_{21}(s) & \hat{S}_{22}(s) & \ldots & \hat{S}_{2N}(s) \\ \ldots & \ldots & \ldots & \ldots \\ \hat{S}_{N1}(s) & \hat{S}_{N2}(s) & \ldots & \hat{S}_{NN}(s) \end{bmatrix}, \quad (1)$$

$$\text{wherein, } \hat{S}_{ij}(s) = \sum_{m=1}^{M} \frac{r_m^{i,j}}{s + p_m^{i,j}}$$

$$[S] = \begin{bmatrix} \sum_{m=1}^{M} \frac{r_m^{1,1}}{s+p_m^{1,1}} & \sum_{m=1}^{M} \frac{r_m^{1,2}}{s+p_m^{1,2}} & \ldots & \sum_{m=1}^{M} \frac{r_m^{1,N}}{s+p_m^{1,N}} \\ \sum_{m=1}^{M} \frac{r_m^{2,1}}{s+p_m^{2,1}} & \sum_{m=1}^{M} \frac{r_m^{2,2}}{s+p_m^{2,2}} & \ldots & \sum_{m=1}^{M} \frac{r_m^{2,N}}{s+p_m^{2,N}} \\ \ldots & \ldots & \ldots & \ldots \\ \sum_{m=1}^{M} \frac{r_m^{1,N}}{s+p_m^{1,N}} & \sum_{m=1}^{M} \frac{r_m^{2,N}}{s+p_m^{2,N}} & \ldots & \sum_{m=1}^{M} \frac{r_m^{N,N}}{s+p_m^{N,N}} \end{bmatrix} \quad (2)$$

$$= \sum_{m=1}^{M} \sum_{i=1}^{N} \sum_{j=1}^{i} \frac{r_m^{i,j}}{s+p_m^{i,j}} E_{i,j}.$$

wherein M represents control precision of the function, N represents the number of the ports of the circuit, $r_m$ represents residue values, $p_m$ represents pole values, $s = \omega = 2\pi f$, $f$ represents a frequency of a test signal, and $E_{i,j}$ represents a matrix.

7. The method as claimed in claim 5, before enforcing passivity of the non-common-pole rational function further comprising:
 determining if the non-common-pole rational function satisfies the determined passivity requirement.

8. The method as claimed in claim 7, wherein if the non-common-pole rational function satisfies the determined passivity requirement is determined by:
 converting the non-common-pole rational function to a state-space matrix;
 substituting the state-space matrix into a Hamiltonian matrix, analyzing if eigenvalues of the Hamiltonian matrix have pure imaginaries, and determining that the non-common-pole rational function of the S-parameters satisfies a determined passivity requirement if the eigenvalues of the Hamiltonian matrix have pure imaginaries, or determining that the non-common-pole rational function of the S-parameters does not satisfy the determined passivity requirement if the eigenvalues of the Hamiltonian matrix have no pure imaginaries.

9. A non-transitory computer readable medium storing a set of instructions, the set of instructions capable of being executed by a processor of a computing device to perform a method for enforcing passivity of scattering parameter (S-parameter) equivalent circuit, the method comprising:
 reading a S-parameter file from a storage device, wherein the S-parameter file lists S-parameters measured at ports of a circuit at different signal frequencies;
 creating a non-common-pole rational function of the S-parameters by applying a vector fitting algorithm to the S-parameters;
 enforcing passivity of the non-common-pole rational function if the non-common-pole rational function does not satisfy a determined passivity requirement; and
 generating an equivalent circuit model of the circuit according to the non-common-pole rational function which satisfies the determined passivity requirement by enforcing passivity.

10. The non-transitory computer readable medium as claimed in claim 9, wherein passivity of the non-common-pole rational function is enforced by:
 converting the non-common-pole rational function which is showed using a function labeled (1) to a function labeled (2):

$$S(s) \approx \hat{S}(s) = \begin{bmatrix} \hat{S}_{11}(s) & \hat{S}_{12}(s) & \ldots & \hat{S}_{1N}(s) \\ \hat{S}_{21}(s) & \hat{S}_{22}(s) & \ldots & \hat{S}_{2N}(s) \\ \ldots & \ldots & \ldots & \ldots \\ \hat{S}_{N1}(s) & \hat{S}_{N2}(s) & \ldots & \hat{S}_{NN}(s) \end{bmatrix}, \quad (1)$$

$$\text{wherein, } \hat{S}_{ij}(s) = \sum_{m=1}^{M} \frac{r_m^{i,j}}{s + p_m^{i,j}}$$

$$[S] = \begin{bmatrix} \sum_{m=1}^{M} \frac{r_m^{1,1}}{s+p_m^{1,1}} & \sum_{m=1}^{M} \frac{r_m^{1,2}}{s+p_m^{1,2}} & \ldots & \sum_{m=1}^{M} \frac{r_m^{1,N}}{s+p_m^{1,N}} \\ \sum_{m=1}^{M} \frac{r_m^{2,1}}{s+p_m^{2,1}} & \sum_{m=1}^{M} \frac{r_m^{2,2}}{s+p_m^{2,2}} & \ldots & \sum_{m=1}^{M} \frac{r_m^{2,N}}{s+p_m^{2,N}} \\ \ldots & \ldots & \ldots & \ldots \\ \sum_{m=1}^{M} \frac{r_m^{1,N}}{s+p_m^{1,N}} & \sum_{m=1}^{M} \frac{r_m^{2,N}}{s+p_m^{2,N}} & \ldots & \sum_{m=1}^{M} \frac{r_m^{N,N}}{s+p_m^{N,N}} \end{bmatrix} = \quad (2)$$

$$\sum_{m=1}^{M} \sum_{i=1}^{N} \sum_{j=1}^{i} \frac{r_m^{i,j}}{s+p_m^{i,j}} E_{i,j}$$

wherein M represents control precision of the function, N represents the number of the ports of the circuit, $r_m$ represents residue values, $p_m$ represents pole values, $s = \omega = 2\pi f$, $f$ represents frequency of a test signal, and $E_{i,j}$ represents a matrix.

11. The non-transitory computer readable medium as claimed in claim 9, wherein the method further comprises:
 determining if the non-common-pole rational function satisfies the determined passivity requirement.

12. The non-transitory computer readable medium as claimed in claim 11, wherein if the non-common-pole rational function satisfies the determined passivity requirement is determined by:
 converting the non-common-pole rational function to a state-space matrix; substituting the state-space matrix into a Hamiltonian matrix, analyzing if eigenvalues of the Hamiltonian matrix have pure imaginaries, and determining that the non-common-pole rational function of the S-parameters satisfies a determined passivity requirement if the eigenvalues of the Hamiltonian matrix have pure imaginaries, or determining that the non-common-pole rational function of the S-parameters does not satisfy the determined passivity requirement if the eigenvalues of the Hamiltonian matrix have no pure imaginaries.

* * * * *